(12) United States Patent
Arayama

(10) Patent No.: US 8,000,951 B2
(45) Date of Patent: Aug. 16, 2011

(54) TIMING ANALYSIS METHOD AND APPARATUS FOR ENHANCING ACCURACY OF TIMING ANALYSIS AND IMPROVING WORK EFFICIENCY THEREOF

(75) Inventor: Masashi Arayama, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 850 days.

(21) Appl. No.: 11/652,043

(22) Filed: Jan. 11, 2007

(65) Prior Publication Data
US 2008/0154571 A1 Jun. 26, 2008

(30) Foreign Application Priority Data
Oct. 6, 2006 (JP) .................................. 2006-275428

(51) Int. Cl.
*G06F 17/50* (2006.01)
(52) U.S. Cl. ........................ 703/19; 716/108; 716/113
(58) Field of Classification Search ................ 716/4, 6, 716/108.113; 703/19
See application file for complete search history.

(56) References Cited

U.S. PATENT DOCUMENTS

| | | | |
|---|---|---|---|
| 6,405,348 B1 * | 6/2002 | Fallah-Tehrani et al. | 716/4 |
| 6,434,728 B1 * | 8/2002 | Arayama et al. | 716/113 |
| 6,654,938 B2 | 11/2003 | Kosugi | |
| 6,983,432 B2 * | 1/2006 | Hayes | 716/4 |
| 7,107,558 B2 * | 9/2006 | Tetelbaum et al. | 716/6 |
| 7,506,293 B2 * | 3/2009 | Dasdan et al. | 716/6 |
| 7,590,953 B2 * | 9/2009 | Chang | 716/4 |
| 7,650,583 B2 * | 1/2010 | Chang | 716/6 |

FOREIGN PATENT DOCUMENTS

| | | |
|---|---|---|
| JP | 10-063693 | 3/1998 |
| JP | 2002-215710 | 8/2002 |

OTHER PUBLICATIONS

Kostya, CAD of VLSI systems (046880) Lecture 12: Verification of Circuit Timing—part 1, Jan. 22, 2007, pp. 1-16.*
Marco Delaurenti, Design and Optimization Techniques of High-Speed VLSI Circuits, PhD Dissertation, Dec. 1999, p. 83.*

* cited by examiner

*Primary Examiner* — Paul L Rodriguez
*Assistant Examiner* — Juan Ochoa
(74) *Attorney, Agent, or Firm* — Fujitsu Patent Center

(57) ABSTRACT

A timing analysis apparatus has a block simulation information storing section, a SPICE deck generating section, and a feedback-based static timing analyzing section. The block simulation information storing section stores simulation information for each block when performing circuit analysis by partitioning a circuit into blocks, the SPICE deck generating section generates a SPICE deck by interconnecting the blocks, for a path that needs analysis, by using a result of static timing analysis and using simulation conditions for the each block. The feedback-based static timing analyzing section causes a result of the simulation performed using the generated SPICE deck to be reflected in the static timing analysis.

7 Claims, 22 Drawing Sheets

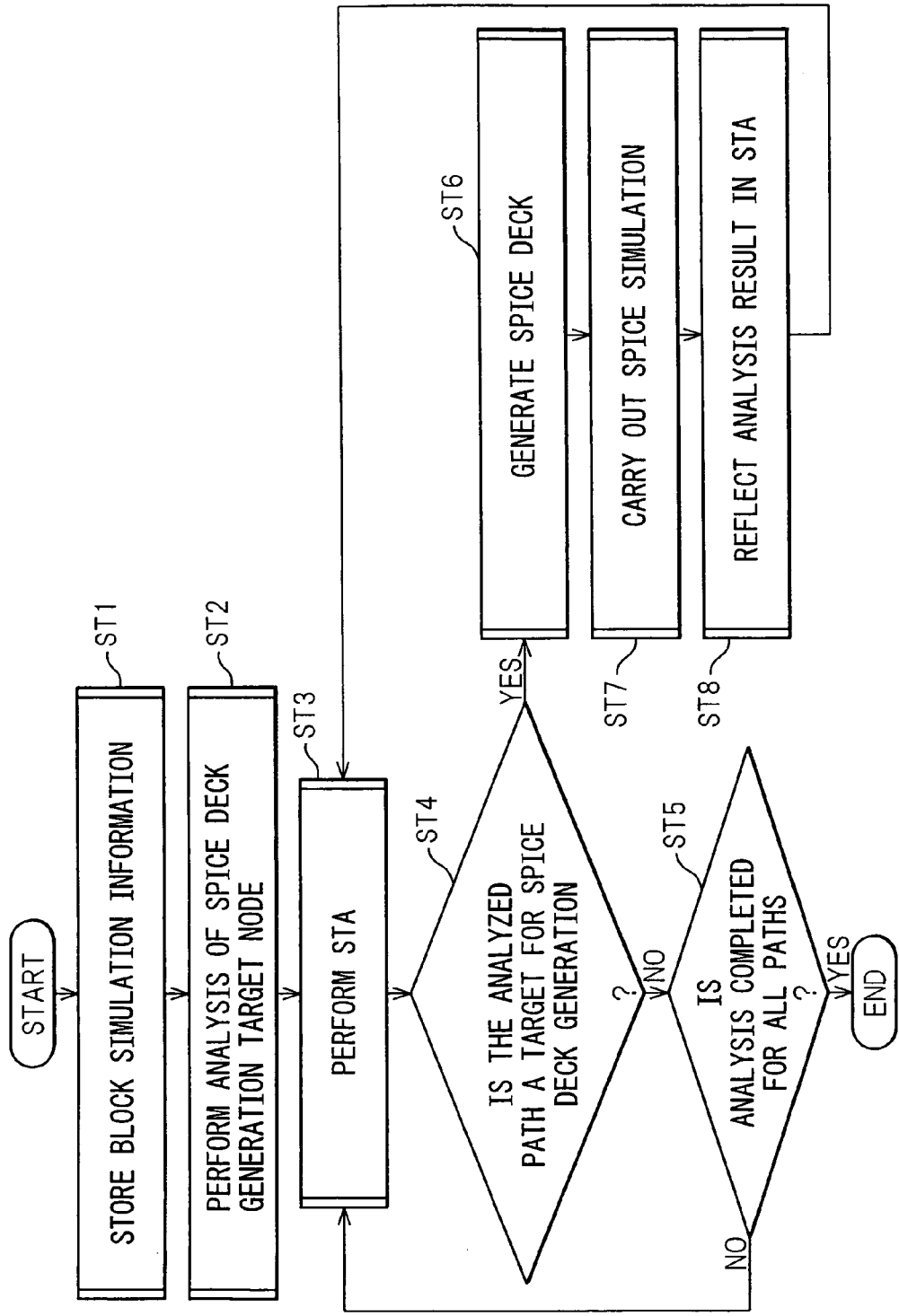

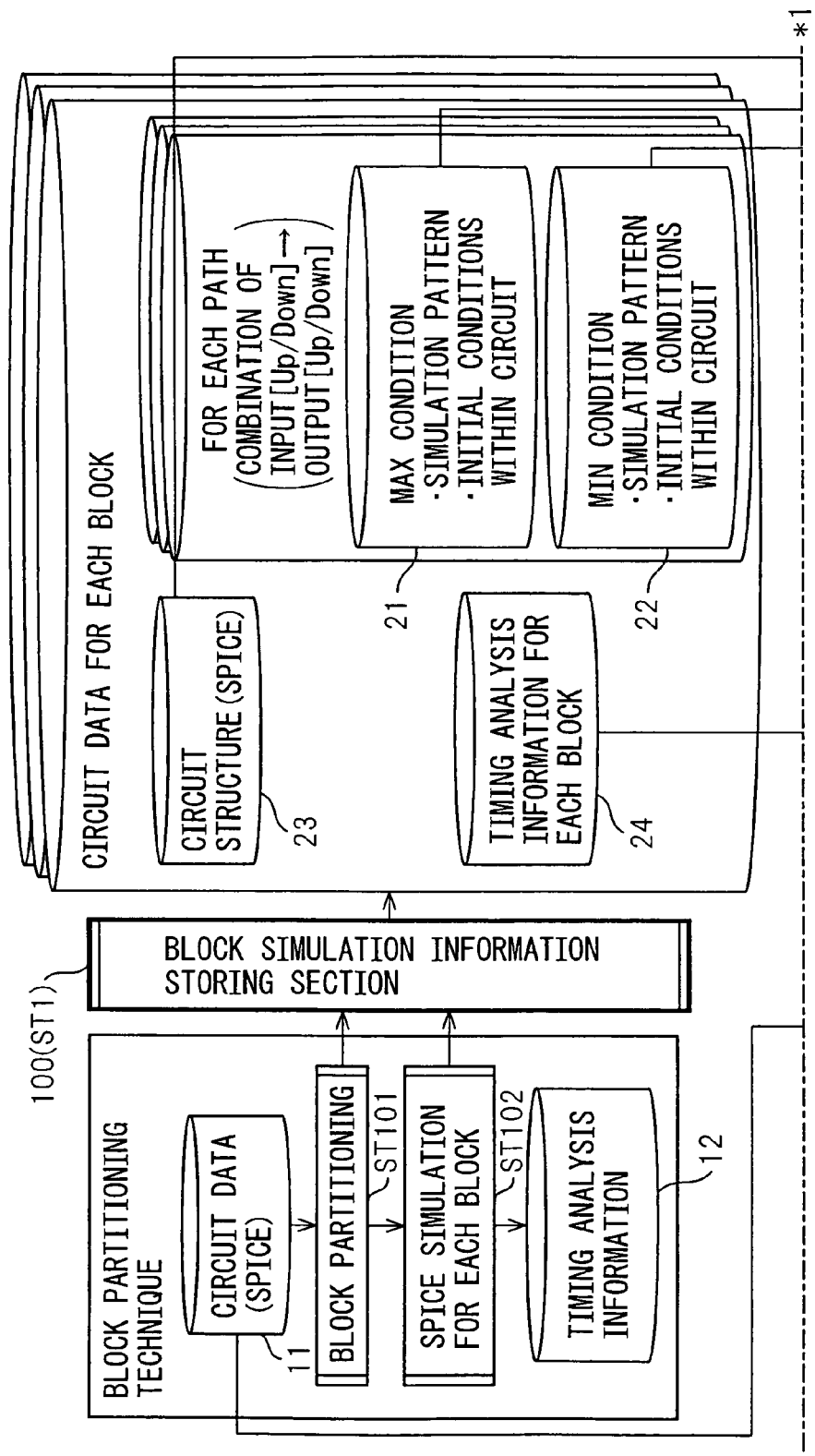

| CONDITION | INPUT SIGNAL | OUTPUT SIGNAL | INPUT TERMINAL | OUTPUT TERMINAL |
|---|---|---|---|---|
| MAX | Up | Up | ... | ... |
| MAX | Up | Down | ... | ... |
| MAX | Down | Up | ... | ... |
| MAX | Down | Down | ... | ... |
| MIN | Up | Up | ... | ... |
| MIN | Up | Down | ... | ... |
| MIN | Down | Up | ... | ... |
| MIN | Down | Down | ... | ... |

Fig.15

SIMULATION INFORMATION FOR EACH BLOCK

24(21,22)

BLOCK 1

| CONDITION | INPUT (TRANSITION) | OUTPUT (TRANSITION) | PATTERN | INPUT WAVEFORM (SECOND) / SLOPE OF WAVEFORM (VOLTAGE/SECOND) | OUTPUT WAVEFORM (SECOND) / SLOPE OF WAVEFORM (VOLTAGE/SECOND) |
|---|---|---|---|---|---|
| MAX | A(Up) | XA(Down) | — | ⋮ | ⋮ |
| MAX | A(Down) | XA(Up) | — | ⋮ | ⋮ |
| MIN | A(Up) | XA(Down) | — | ⋮ | ⋮ |
| MIN | A(Down) | XA(Up) | — | ⋮ | ⋮ |

BLOCK 2

| CONDITION | INPUT (TRANSITION) | OUTPUT (TRANSITION) | PATTERN | INPUT WAVEFORM (SECOND) / SLOPE OF WAVEFORM (VOLTAGE/SECOND) | OUTPUT WAVEFORM (SECOND) / SLOPE OF WAVEFORM (VOLTAGE/SECOND) |
|---|---|---|---|---|---|
| MAX | XA(Up) | X(Down) | B:1 | ⋮ | ⋮ |
| MAX | XA(Down) | X(Up) | B:1 | ⋮ | ⋮ |
| MAX | B(Up) | X(Down) | XA:1 | ⋮ | ⋮ |
| MAX | B(Down) | X(Up) | XA:1 | ⋮ | ⋮ |

Fig.16

CIRCUIT CONFIGURATION FOR EACH BLOCK 23

| BLOCK 1 | | | | | | |
|---|---|---|---|---|---|---|
| MP1 | XA | A | VDD | VDD | PMOS | ... |
| MN1 | XA | A | VSS | VSS | NMOS | ... |

| BLOCK 2 | | | | | | |
|---|---|---|---|---|---|---|
| MP2_1 | X | XA | VDD | VDD | PMOS | ... |
| MP2_2 | X | B | VDD | VDD | PMOS | ... |
| MN2_1 | X | XA | VSS | VSS | NMOS | ... |
| MN2_2 | X | B | VSS | VSS | NMOS | ... |

Fig.17

```
Template :
  MP  IN  OUT  VDD  VDD  PMOS ...
  MP  IN  OUT  VSS  VSS  NMOS ...
BackTrace :
  IN
```

} TRANSISTOR CONFIGURATION

} BACK-TRACE TARGET NODE

Fig.18

SPICE DECK GENERATION TARGET NODE 34

| A |
|---|

Fig.19

SIMULATION INFORMATION FOR EACH BLOCK 24(21,22)

BLOCK 1

| CONDITION | INPUT (TRANSITION) | OUTPUT (TRANSITION) | PATTERN | INPUT WAVEFORM (SECOND)/ SLOPE OF WAVEFORM (VOLTAGE/SECOND) | OUTPUT WAVEFORM (SECOND)/ SLOPE OF WAVEFORM (VOLTAGE/SECOND) |
|---|---|---|---|---|---|
| MAX | A(Up) | XA(Down) | — | ⋮ | ⋮ |
| MAX | A(Down) | XA(Up) | — | ⋮ | ⋮ |
| MIN | A(Up) | XA(Down) | — | ⋮ | ⋮ |
| MIN | A(Down) | XA(Up) | — | ⋮ | ⋮ |

BLOCK 2

| CONDITION | INPUT (TRANSITION) | OUTPUT (TRANSITION) | PATTERN | INPUT WAVEFORM (SECOND)/ SLOPE OF WAVEFORM (VOLTAGE/SECOND) | OUTPUT WAVEFORM (SECOND)/ SLOPE OF WAVEFORM (VOLTAGE/SECOND) |
|---|---|---|---|---|---|
| MAX | XA(Up) | X(Down) | B : 1 | | |
| MAX | XA(Down) | X(Up) | B : 1 | | |
| MAX | B(Up) | X(Down) | XA : 1 | ⋮ | ⋮ |
| MAX | B(Down) | X(Up) | XA : 1 | | |

Fig.20

CIRCUIT CONFIGURATION FOR EACH BLOCK 23

| BLOCK 1 |
|---|
| MP1  XA  A   VDD  VDD  PMOS  ... <br> MN1  XA  A   VSS  VSS  NMOS  ... |

| BLOCK 2 |
|---|
| MP2_1  X   XA  VDD  VDD  PMOS  ... <br> MP2_2  X   B   VDD  VDD  PMOS  ... <br> MN2_1  X   XA  VSS  VSS  NMOS  ... <br> MN2_2  X   B   VSS  VSS  NMOS  ... |

Fig.21

SPICE DECK GENERATION TARGET NODE 34

| |
|---|
| A |

Fig.22

RESULTS OF HIGH-ACCURACY DELAY ANALYSIS

ENTIRE CIRCUIT                                                                                          37

| CONDITION | INPUT (TRANSITION) | OUTPUT (TRANSITION) | INPUT WAVEFORM (SECOND)/ SLOPE OF WAVEFORM (VOLTAGE/SECOND) | OUTPUT WAVEFORM (SECOND)/ SLOPE OF WAVEFORM (VOLTAGE/SECOND) |
|---|---|---|---|---|
| MAX | A(Up) | X(Up) | ... | ... |
| MAX | A(Down) | X(Down) | ... | ... |
| MAX | B(Up) | X(Down) | ... | ... |
| MAX | B(Down) | X(Up) | ... | ... |
| MIN | A(Up) | X(Up) | ... | ... |
| MIN | A(Down) | X(Down) | ... | ... |
| MIN | B(Up) | X(Down) | ... | ... |
| MIN | B(Down) | X(Up) | ... | ... |

Fig.23

SIMULATION INFORMATION FOR EACH BLOCK — 21,22(24)

BLOCK 1

| CONDITION | INPUT (TRANSITION) | OUTPUT (TRANSITION) | PATTERN | INPUT WAVEFORM (SECOND) / SLOPE OF WAVEFORM (VOLTAGE/SECOND) | OUTPUT WAVEFORM (SECOND) / SLOPE OF WAVEFORM (VOLTAGE/SECOND) |
|---|---|---|---|---|---|
| MAX | A(Up) | XA(Down) | — | | |
| MAX | A(Down) | XA(Up) | — | ... | ... |
| MIN | A(Up) | XA(Down) | — | ... | ... |
| MIN | A(Down) | XA(Up) | — | ... | ... |

BLOCK 2

| CONDITION | INPUT (TRANSITION) | OUTPUT (TRANSITION) | PATTERN | INPUT WAVEFORM (SECOND) / SLOPE OF WAVEFORM (VOLTAGE/SECOND) | OUTPUT WAVEFORM (SECOND) / SLOPE OF WAVEFORM (VOLTAGE/SECOND) |
|---|---|---|---|---|---|
| MAX | XA(Up) | X(Down) | B : 1 | | |
| MAX | XA(Down) | X(Up) | B : 1 | ... | ... |
| MAX | B(Up) | X(Down) | XA : 1 | ... | ... |
| MAX | B(Down) | X(Up) | XA : 1 | ... | ... |

CIRCUIT CONFIGURATION
FOR EACH BLOCK

BLOCK 1

| MP1 | XA | A | VDD | VDD | PMOS | ... |
| MN1 | XA | A | VSS | VSS | NMOS | ... |

BLOCK 2

| MP2_1 | X | XA | VDD | VDD | PMOS | ... |
| MP2_2 | X | B  | VDD | VDD | PMOS | ... |
| MN2_1 | X | XA | VSS | VSS | NMOS | ... |
| MN2_2 | X | B  | VSS | VSS | NMOS | ... |

| MP1   | XA | A   | VDD | VDD | PMOS | ... |
| MN1   | XA | A   | VSS | VSS | NMOS | ... |
| MP2_1 | X  | XA  | VDD | VDD | PMOS | ... |
| MP2_2 | X  | VDD | VDD | VDD | PMOS | ... |
| MN2_1 | X  | XA  | VSS | VSS | NMOS | ... |
| MN2_2 | X  | VDD | VSS | VSS | NMOS | ... |

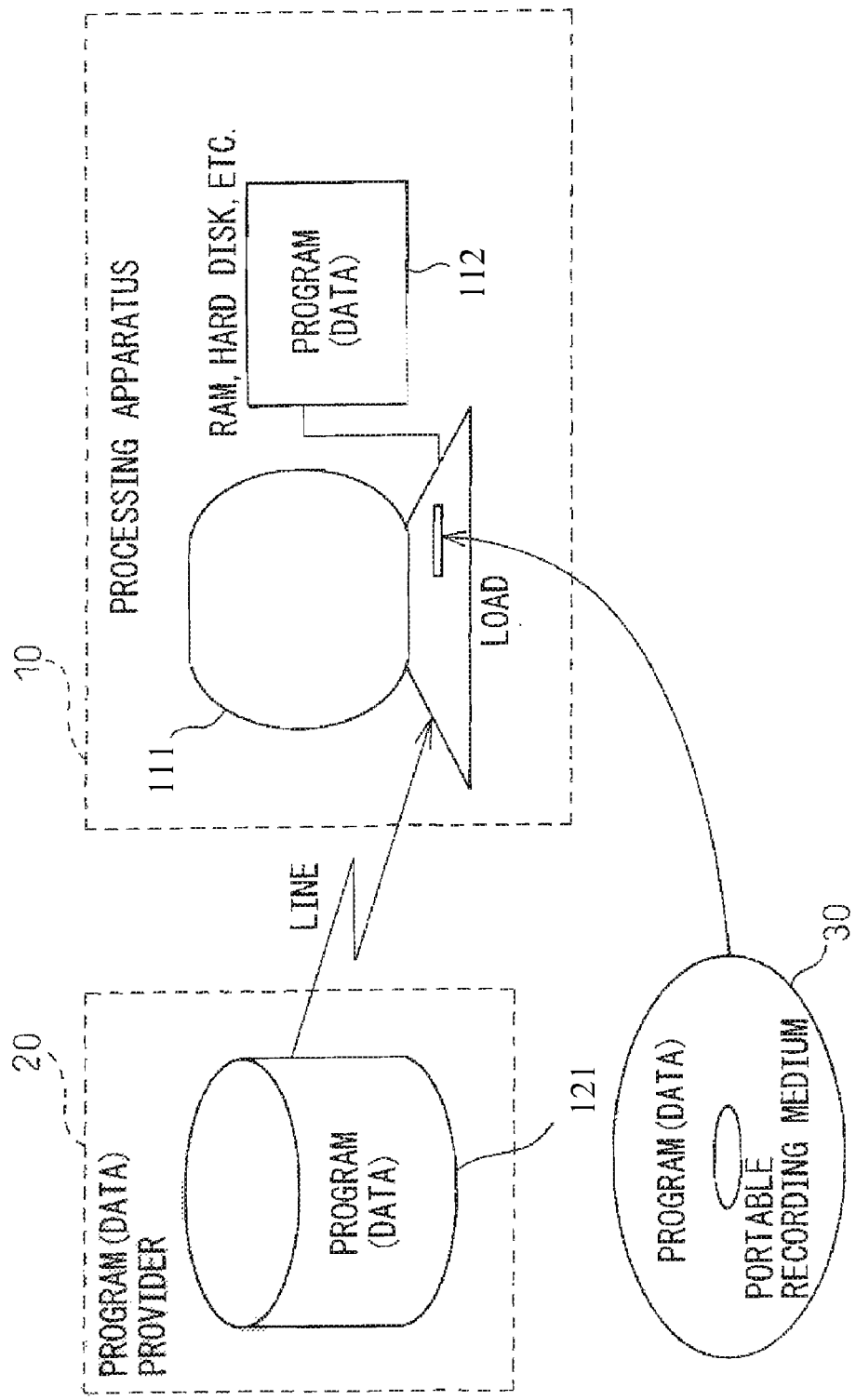

TIMING ANALYSIS METHOD AND APPARATUS FOR ENHANCING ACCURACY OF TIMING ANALYSIS AND IMPROVING WORK EFFICIENCY THEREOF

CROSS REFERENCE TO RELATED APPLICATION

This application is based upon and claims the benefit of priority from the prior Japanese Patent Application No. 2006-275428, filed on Oct. 6, 2006, the entire contents of which are incorporated herein by reference.

BACKGROUND OF THE INVENTION

1. Field of the Invention

The present invention relates to a timing analysis method and apparatus. More particularly, the present invention relates to a timing analysis method and apparatus for large-scale integrated circuits.

2. Description of the Related Art

Recently, extremely accurate timing analysis has been required in designing recent ultra-high-speed LSIs that operate at clock frequencies exceeding several GHz. Techniques that perform timing analysis based on simulation using the industry standard SPICE have long been known in the art, but such techniques require a very long processing time to finish and, with the ever increasing scale of circuit integration, the situation is reaching the point where it is no longer possible to finish timing analysis in a practical time.

In these techniques, the following method is known for providing an effective solution. First, the circuit to be analyzed is partitioned into small-scale blocks. SPICE simulation is performed on a block-by-block basis, and the results of the simulation are stored in the form of a library. Then, using the library thus created for each block, STA (Static Timing Analysis) of the entire circuit is performed to analyze the timing operations of the LSI circuit.

More specifically, in the prior art, the timing analysis of a large-scale integrated (LSI) circuit has been performed, for example, in the following procedure.

(1) First, from the circuit to be analyzed, a circuit is extracted that has a scale that can be simulated using SPICE, or the circuit is corrected to a scale that can be simulated using SPICE. The circuit extraction (correction) here is done manually or using a tool.

(2) Next, simulation conditions (simulation patterns, etc.) are manually set for the circuit to be analyzed, and the SPICE simulation is carried out.

(3) The above steps (1) and (2) are repeated to complete the timing analysis of the entire circuit.

This technique is effective and makes it possible to accomplish the timing analysis in a practical time. However, in the case of LSI circuits for which feature sizes are decreasing and the packing density increasing year by year, it is not possible, even with the above technique, to provide the necessary accuracy for paths, such as a clock path, that require high accuracy.

In the prior art, Japanese Unexamined Patent Publication (Kokai) No. 10-063693 proposes a delay time calculation method that can calculate delays times at high speed and with high accuracy for large-scale logic circuits; in this method, for every path that requires a high-accuracy calculation, a high-accuracy calculation target path condition library is taken as an input, the path that matches the condition is selected by referring to the path signal delay time obtained by a static delay calculation, and circuit simulation data for the selected path and input signals (test patterns) to the circuit simulation are generated based on the logic circuit connection information for that selected path.

Further, in the prior art, Japanese Unexamined Patent Publication (Kokai) No. 2002-215710 proposes a method wherein, in a full-custom LSI design, even when the circuit design or signal propagation conditions are partially changed, the delay characteristics are analyzed quickly and accurately by using the results of the analysis performed on the original circuit; in this method, the netlist is partitioned into unit blocks, circuit blocks of prescribed scale are formed by combining the unit blocks in accordance with prescribed conditions, dynamic timing analysis is performed on each circuit block to create a delay characteristic library containing the results of the analysis and, by applying the library to static timing analysis, the analysis target circuit described by the netlist is treated as a collection of circuit blocks and the propagation delay along the desired signal path is analyzed.

However, in the above-described prior art timing analysis methods for large-scale integrated circuits, the simulation conditions for the extracted (corrected) circuit differed considerably from the actual circuit operation, giving rise to the problem of poor accuracy. Furthermore, the scale of the extracted circuit tended to become large in order to increase the accuracy, and it took considerable time to complete one SPICE simulation. Further, since the simulation conditions such as simulation patterns had to be set manually, the whole task was very laborious.

SUMMARY OF THE INVENTION

An object of the present invention is to provide a timing analysis method and apparatus that can enhance the accuracy of timing analysis while, at the same time, improving work efficiency for the timing analysis.

According to the present invention, there is provided a timing analysis method comprising storing simulation information for each block when performing circuit analysis by partitioning a circuit into blocks; identifying a path that needs analysis; generating a SPICE deck by interconnecting the blocks, for the path that needs analysis, by using a result of static timing analysis and using simulation conditions for the each block; and causing a result of the simulation performed using the generated SPICE deck to be reflected in the static timing analysis.

According to the present invention, there is also provided a timing analysis apparatus comprising a block simulation information storing section storing simulation information for each block when performing circuit analysis by partitioning a circuit into blocks; a SPICE deck generating section, generating a SPICE deck by interconnecting the blocks, for a path that needs analysis, by using a result of static timing analysis and using simulation conditions for the each block; and a feedback-based static timing analyzing section causing a result of the simulation performed by using the generated SPICE deck to be reflected in the static timing analysis.

The simulation may be a SPICE simulation. In identifying the path, a SPICE deck generation target node may be obtained by using a template. The template may be an inverter template, a flip-flip circuit template, or a feedback loop template.

In identifying the path, if a circuit that matches the template is found, back-tracing may be performed starting from a designated terminal of the circuit that matches the template, and a node passed through during the back-tracing may be taken as the SPICE deck generation target node. The back-tracing may be performed in a direction going from a drain terminal of a transistor to a source terminal or a gate terminal thereof.

In identifying the path, an arbitrary node name may be specified and, if a node that matches the node name is found, the node may be taken as the SPICE deck generation target node. If the SPICE deck generation target node is located on a critical path calculated using the static timing analysis, the result of the static timing analysis may be substituted by the result of the simulation performed using the SPICE deck, and the static timing analysis may be performed once again.

Further, according to the present invention, there is provided a timing analysis program for making a computer perform circuit timing analysis by causing the computer to execute a procedure for storing simulation information for each block when performing circuit analysis by partitioning a circuit into blocks; a procedure for identifying a path that needs analysis; a procedure for generating for the path that needs analysis a SPICE deck by interconnecting the blocks by using a result of static timing analysis and using simulation conditions for the each block; and a procedure for causing a result of the simulation performed using the generated SPICE deck to be reflected in the static timing analysis.

BRIEF DESCRIPTION OF THE DRAWINGS

The present invention will be more clearly understood from the description of the preferred embodiments as set forth below with reference to the accompanying drawings, wherein:

FIG. 1 is a flowchart showing one example of the overall process flow of a timing analysis method according to the present invention;

FIG. 2 is a diagram showing the connection between FIGS. 2A and 2B;

FIGS. 2A and 2B are block diagrams, combined as shown in FIG. 2, showing one embodiment of a timing analysis apparatus implementing the timing analysis method shown in FIG. 1;

FIG. 15 is a diagram (part 1) showing an example of the output from the block simulation information storing section;

FIG. 16 is a diagram (part 2) showing an example of the output from the block simulation information storing section;

FIG. 17 is a diagram showing an example of the input to a SPICE deck generation path analyzing section;

FIG. 18 is a diagram showing an example of the output from the SPICE deck generation path analyzing section;

FIG. 19 is a diagram (part 1) showing an example of the input to a feedback-based STA section;

FIG. 20 is a diagram (part 2) showing an example of the input to the feedback-based STA section;

FIG. 21 is a diagram (part 3) showing an example of the input to the feedback-based STA section;

FIG. 22 is a diagram showing an example of the output from the feedback-based STA section;

FIG. 23 is a diagram (part 1) showing an example of the input to a SPICE deck generating section;

FIG. 26 is a diagram for explaining a timing analysis program to which the present invention is applied, and an example of a medium having the timing analysis program recorded thereon.

DESCRIPTION OF THE PREFERRED EMBODIMENTS

Before describing in detail the preferred embodiments of the timing analysis method and apparatus according to the present invention, the principles of the present invention will be described first. The invention aims to improve the accuracy of the circuit partitioning technique by the following procedure.

(1) First, block simulation information (only MIN/MAX critical conditions) such as simulation patterns are stored when performing circuit analysis for each block.

(2) Next, a path that need high-accuracy analysis is identified.

(3) Further, for the path that need high-accuracy analysis, a SPICE deck interconnecting the partition blocks is generated by using the result of STA (Static Timing Analysis) and the SPICE simulation conditions for each block, and SPICE simulation is performed. Here, the SPICE deck is a SPICE netlist to be used in the SPICE simulation, and refers to a SPICE netlist in which other simulation conditions are set.

(4) Then, the result of the simulation performed using the SPICE deck is reflected in STA, thus improving the accuracy of the timing analysis.

In this way, in the present invention, a high-accuracy, small-block-level SPICE deck is created by partitioning the circuit into blocks and by using the result of STA as well as the simulation conditions for each block. Further, in the present invention, when carrying out the block partitioning technique, the MIN/MAX critical conditions are saved and, by using the thus saved conditions, the simulation conditions such as simulation patterns can be set automatically without human intervention, and work efficiency can thus be improved.

Therefore, according to the present invention, a high-accuracy analysis can be accomplished in a short time by performing SPICE simulation using the small-scale, high-accuracy SPICE deck, and highly accurate timing analysis data can be produced by feeding back to STA the result of the analysis performed using the SPICE deck; furthermore, by automatically setting the simulation conditions, work efficiency for the timing analysis can be increased.

Next, the preferred embodiments of the timing analysis method and apparatus according to the present invention will be described in detail with reference to the accompanying drawings.

Figure 2B:
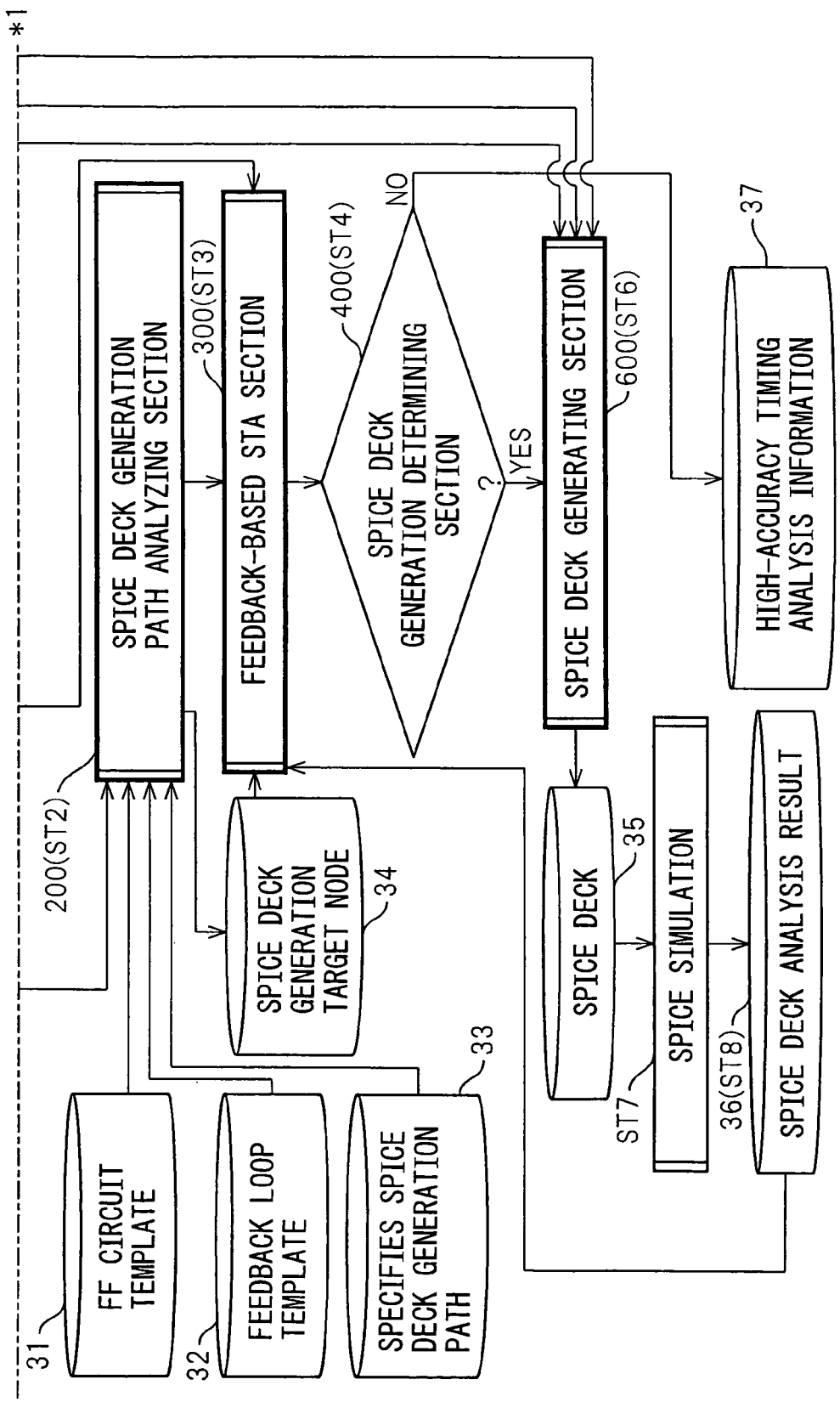

FIG. 1 is a flowchart showing one example of the overall process flow of the timing analysis method according to the present invention. FIG. 2 is a diagram showing the connection between FIGS. 2A and 2B, and FIGS. 2A and 2B are block diagrams, combined as shown in FIG. 2, showing one embodiment of a timing analysis apparatus implementing the timing analysis method shown in FIG. 1. In FIG. 2 (FIGS. 2A and 2B), reference numeral 100 is a block simulation information storing section, 200 is a SPICE deck generation path analyzing section, 300 is a feedback-based STA section, and 600 is a SPICE deck generating section. Reference numerals 11, 12, 21 to 24, and 31 to 37 indicate storage devices (or data stored (saved) in the respective storage devices).

As shown in FIG. 1, when the timing analysis process is started, first the block simulation information is stored in step ST1, and the process proceeds to step ST2. The block simulation information here refers to the information relating to the block simulation performed using a known block partitioning technique.

More specifically, as shown in FIG. 2, the block partitioning technique partitions the circuit into blocks, for example, in step ST101, by using the circuit data (SPICE) 11 stored in the corresponding storage device, and then proceeds to step ST102 to perform SPICE simulation for each block and stores the resulting timing analysis information 12 in the corresponding storage device.

In step ST2, the analysis of a SPICE deck generation target node, that is, the analysis of a SPICE deck generation path 33, is performed, after which the process proceeds to step ST3.

In step ST3, STA (Static Timing Analysis) is performed, after which the process proceeds to step ST4; if it is determined in step ST4 that the analyzed path (critical path) is not a target for SPICE deck generation, the process proceeds to step ST5. In step ST5, it is determined whether all the paths have been analyzed, and steps ST3 and ST4 are repeated until the analysis is completed for all the paths. When it is determined in step ST5 that the analysis is completed for all the paths, the timing analysis process is terminated.

On the other hand, if it is determined in step ST4 that the analyzed path is a target for SPICE deck generation, the process proceeds to step ST6 where the SPICE deck is generated, and the process proceeds to step ST7 to perform SPICE simulation. Then, the process proceeds to step ST8 where the result of the analysis performed in step ST7 is reflected in (fed back to) the STA to be performed in step ST3, and steps ST3 and ST4 are repeated until the analysis is completed all the paths.

As shown in FIG. 2, the timing analysis apparatus according to one embodiment of the present invention generally comprises the block simulation information storing section 100, the SPICE deck generation path analyzing section 200, the feedback-based STA section 300, and the SPICE deck generating section 600.

The block simulation information storing section 100 stores the simulation information such as simulation patterns and initial states of internal nodes for the MIN/MAX critical conditions for each path when performing the block-by-block SPICE simulation using the above-described block partitioning technique. This block simulation information is used for the generation of the SPICE deck which will be described later with reference to FIG. 12.

The SPICE deck generation path analyzing section 200 obtains paths that need high-accuracy analysis, examples of such paths including a clock path/data path to a flip-flop (FF). For the implementation of an analysis method for these paths, an FF circuit template (31: FFtp) is considered. In this method, the circuit under analysis is searched for a portion that matches the circuit template, thereby identifying the FF circuit.

Then, in the thus identified circuit, back-tracing is performed starting from the terminal (specified in the template) corresponding to the clock/data (tracing in the direction going from the drain of a transistor to the source or the gate thereof), and every node (transistor terminal) passed through is taken as a SPICE deck generation target. The use of the FF circuit template will be described later with reference to FIG. 6.

However, since the FF circuit is complex in configuration and can be configured in various ways, creating a template that covers all possible configurations will take an enormous amount of time and labor. In view of this, a feedback loop template (32: FLtp) is considered, because every FF circuit contains a feedback loop.

That is, the circuit under analysis is searched for a portion that matches the feedback loop template, thereby identifying the feedback loop. Then, back-tracing is performed in the thus identified circuit, and every node passed through is taken as a SPICE deck generation target. The use of the feedback loop template will be described later with reference to FIG. 7.

Further, the SPICE deck is also generated for an arbitrary path, and a SPICE deck generation target node is specified from an external file so that high-accuracy analysis can be performed. How the arbitrary node name is specified will be described later with reference to FIG. 8.

If it is found as a result of the STA that any node obtained by the SPICE deck generation path analyzing section 200 is located on the analyzed path, the feedback-based STA section 300 generates the SPICE deck in accordance with the procedure performed by the SPICE deck generating section 600 to be described later. Then, the SPICE simulation is carried out using the thus generated SPICE deck, and the result of the calculation is reflected in (fed back to) the STA, after which the STA is performed once again.

Then, if a new path is detected as a MIN/MAX path, and if the path contains a SPICE deck generation target node, the SPICE deck is generated once again, and the result of the calculation is reflected in the STA. This process is repeated to create timing analysis information in which the results of the SPICE deck are reflected. The feedback-based STA section will be described later with reference to FIG. 10.

The SPICE deck generating section 600 generates the SPICE deck using the traced path information obtained by the STA, the result of the block partitioning, and the MIN/MAX critical simulation conditions (simulation patterns, etc.) for each path of the block. The SPICE deck generation will be described later with reference to FIG. 12.

Further, the SPICE deck is generated when any node obtained by the SPICE deck generation path analyzing section 200 is located on the path calculated by the STA. The SPICE deck is generated by interconnecting the partitioned circuit blocks located on the path obtained by the STA. Here, the partitioned circuit blocks located on the path is called the target blocks.

To enable the SPICE simulation to be performed, clipping is done on every empty terminal of each target block in accordance with the simulation patterns stored as the critical simulation conditions (MAX/MIN analysis) for each path of the block. Further, to enhance the analysis accuracy, the block connected to the output terminal of the target block is reproduced. The circuit connected to the target block is called the fan-out block. Clipping is also done on every empty terminal of this fan-out block in accordance with the stored simulation patterns, as in the case of the target block.

Figures 3, 4:
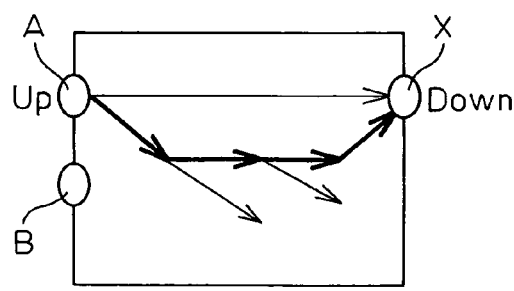
FIG. 3 is a diagram showing one example of block simulation information.
FIG. 4 is a diagram for explaining one example of a block simulation information storing process in FIG. 2.
Figure 5:
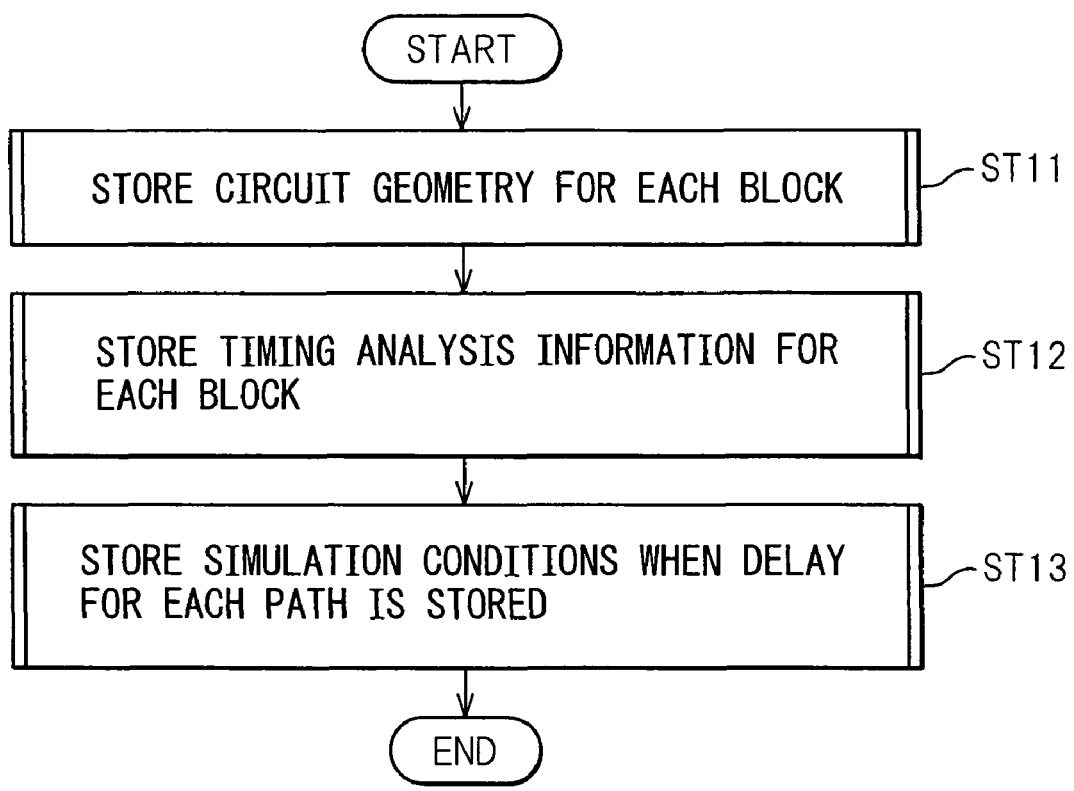
FIG. 5 is a flowchart illustrating in further detail the block simulation information storing process shown in FIG. 4.

FIG. 3 is a diagram showing one example of the block simulation information, FIG. 4 is a diagram for explaining one example of the block simulation information storing process in FIG. 2, and FIG. 5 is a flowchart illustrating in further detail the block simulation information storing process shown in FIG. 4.

The block partitioning technique in FIG. 2 partitions the circuit into blocks, performs simulation on each input terminal and output terminal under the critical conditions of the signal rise (UP) and signal fall (DOWN) minimum time (MIN) and maximum time (MAX), such as shown in FIG. 3, and stores the results for each block.

That is, as shown in FIG. 5, in step ST11 the circuit geometry (circuit data: SPICE) for each block is stored (see the storage device 11 in FIG. 2), and the process proceeds to step ST12 where timing analysis is performed for each block and the resulting information is stored (see the storage device 12 in FIG. 2). The timing analysis information stored here includes, for example, the delay from the input terminal to the output terminal for each path and for each MIN/MAX condition.

Then, the process proceeds to step ST13 where the simulation conditions when the delay for each path is stored (the simulation conditions when the MIN/MAX critical path is stored) are stored (see the storage device 12 in FIG. 2). The simulation conditions stored here include, for example, the simulation patterns and the initial conditions within the circuit, and a maximum of [2(MIN critical condition and MAX critical condition)×2(Input signal transitions Up and Down)×2(Output signal transitions Up and Down)×Number of input terminals×Number of output terminals] is stored.

More specifically, in the example shown in FIG. 4, when the input signal of transition Up is input at the input terminal A and is output as the signal of transition Down at the output terminal X, if the path indicated by the thick arrows is a critical path, the simulation pattern applied to the input terminal, the states of the internal nodes, etc. are stored as the block simulation information (circuit data for each block).

Figure 6:
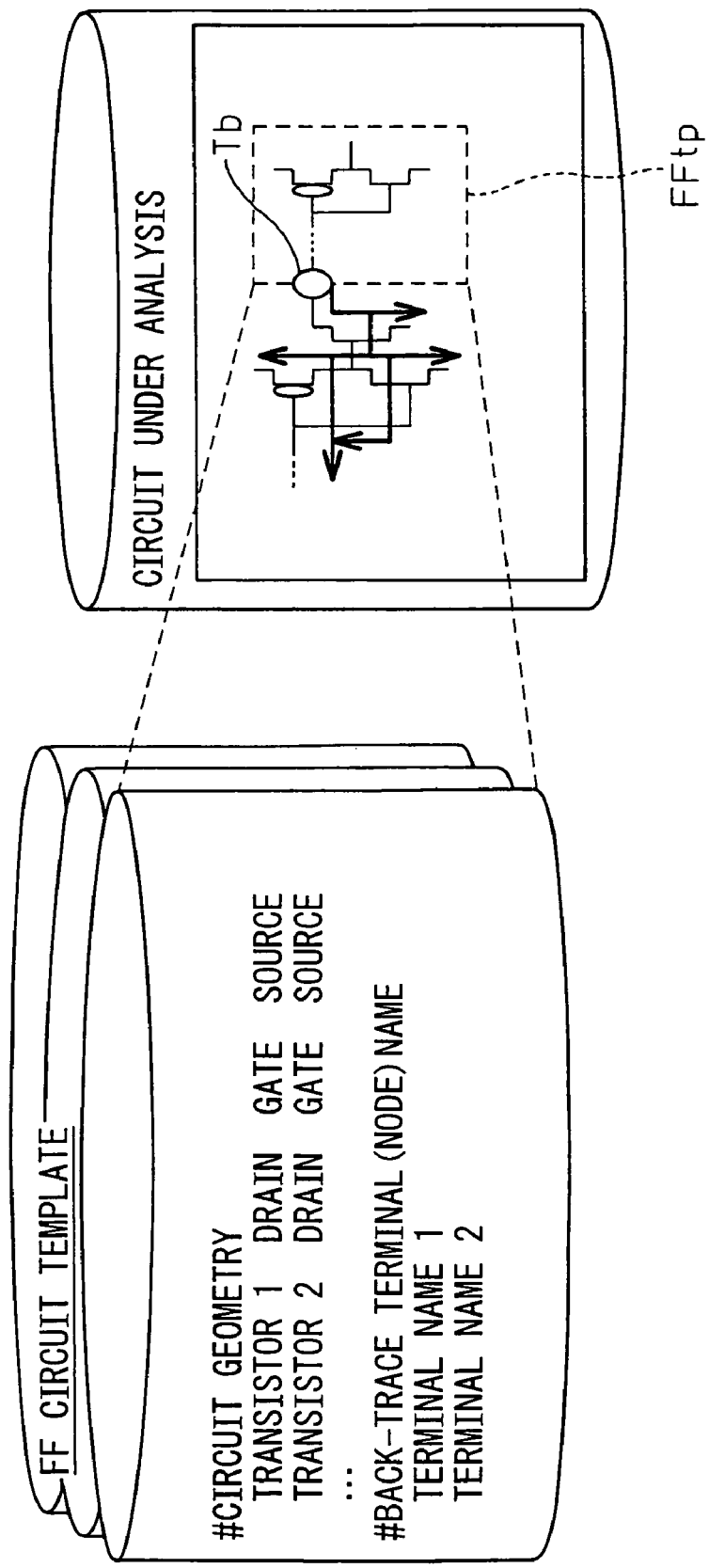
FIG. 6 is a diagram for explaining an example of the use of an FF circuit template in the timing analysis apparatus shown in FIG. 2.
Figure 7:
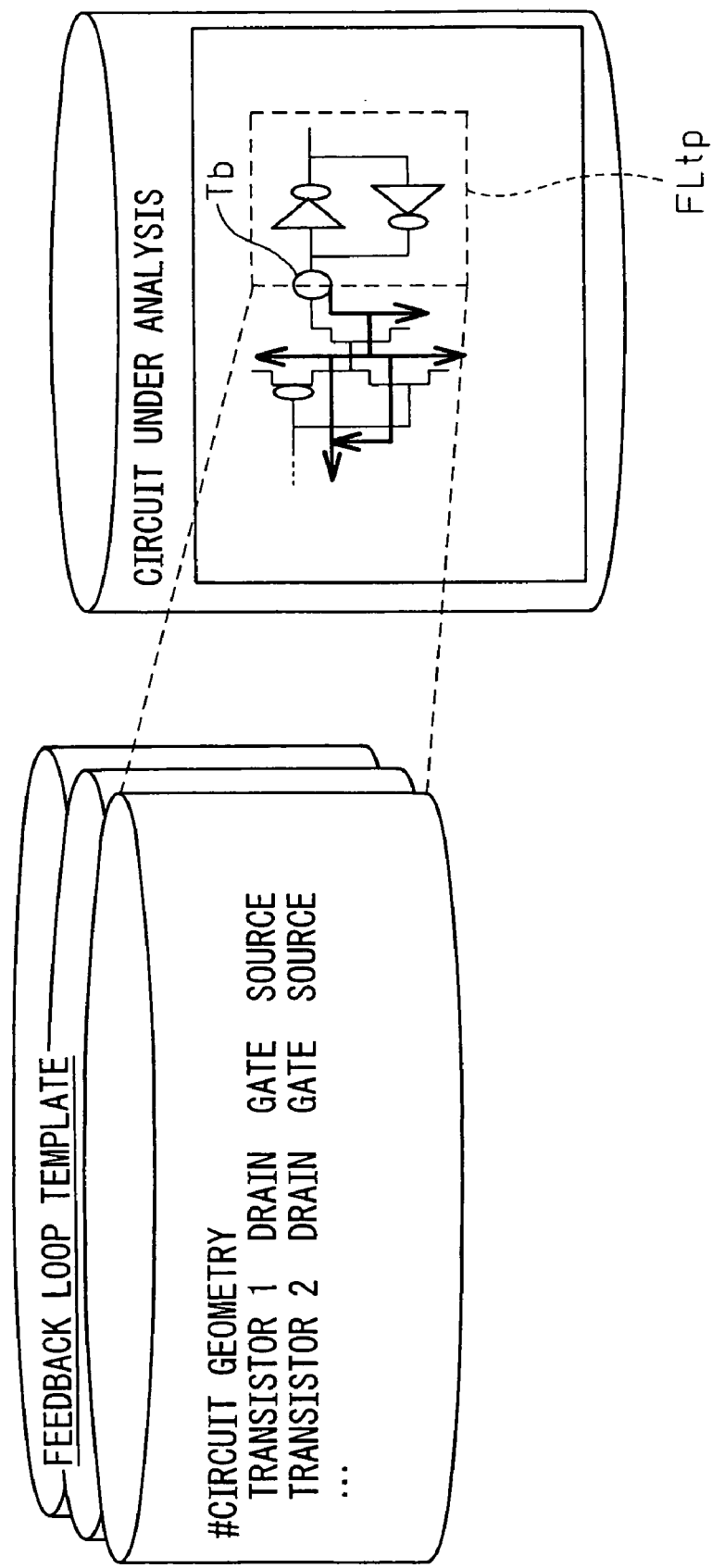
FIG. 7 is a diagram for explaining an example of the use of a feedback loop template in the timing analysis apparatus shown in FIG. 2.
Figure 8:
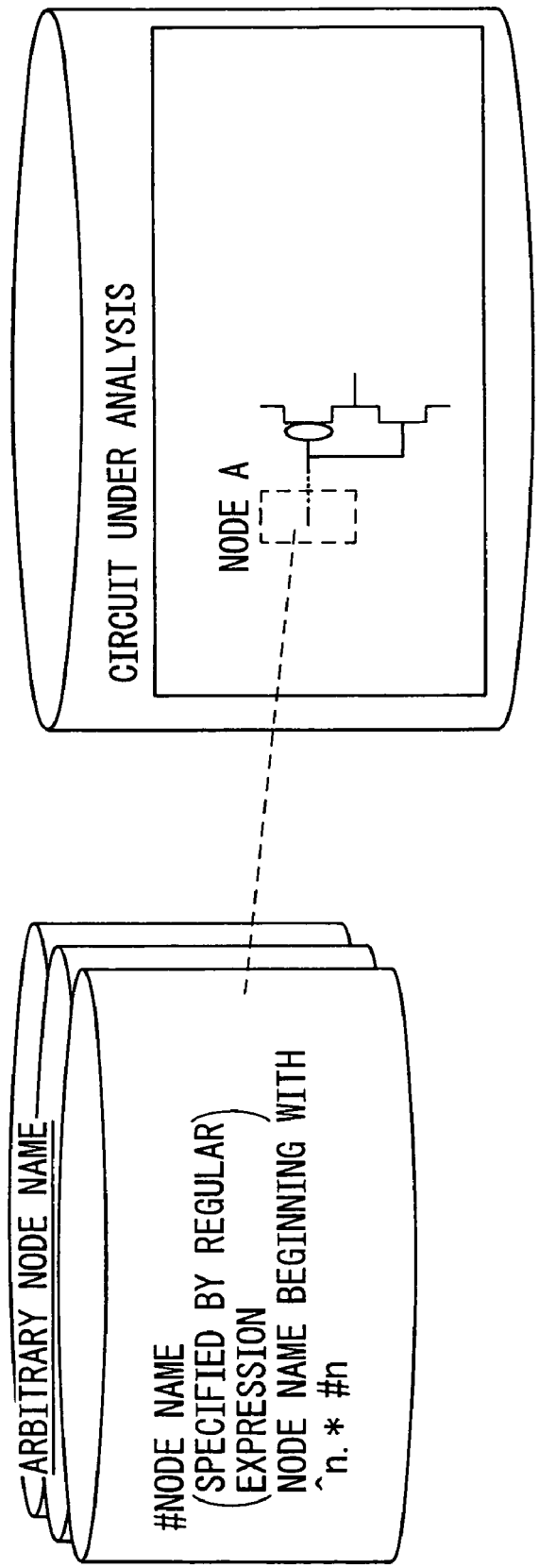
FIG. 8 is a diagram for explaining a SPICE deck generation target node shown in FIG. 2.

FIG. 6 is a diagram for explaining an example of the use of the FF circuit template in the timing analysis apparatus shown in FIG. 2, FIG. 7 is a diagram for explaining an example of the use of the feedback loop template in the timing analysis apparatus shown in FIG. 2, and FIG. 8 is a diagram for explaining the SPICE deck generation target node shown in FIG. 2.

As shown in FIGS. 2 and 6 to 8, the SPICE deck generation path analyzing section 200 performs the following processing to identify a node that needs high-accuracy analysis (the node for which the SPICE deck is to be created).

(1) First, the SPICE deck generation target node is obtained by using the FF circuit template information. More specifically, as shown in FIG. 6, the circuit under analysis is searched for a circuit that matches the FF circuit template FFtp and, if the circuit that matches the FF circuit template FFtp is found, back-tracing is performed starting from the back-trace terminal, and every node passed through is taken as the SPICE deck generation target node.

Here, in FIG. 6, if the terminal indicated by the reference numeral Tb is the back-trace terminal, back-tracing is performed in the direction going from the drain of the transistor to the source or the gate thereof, as indicated by arrows in the figure.

(2) Next, the SPICE deck generation target node is obtained by using the feedback loop template information. More specifically, as shown in FIG. 7, the circuit under analysis is searched for a circuit that matches the feedback loop template FLtp. If the circuit that matches the feedback loop template FLtp is found, back-tracing is performed starting from the back-trace terminal Tb, and every node passed through is taken as the SPICE deck generation target node.

(3) Further, the SPICE deck generation target node is obtained by specifying an arbitrary node name. More specifically, as shown in FIG. 8, the SPICE deck is also generated for an arbitrary path, and the SPICE deck generation target node is specified from an external file so that high-accuracy analysis can be performed. This arbitrary node name is specified by using, for example, the regular expression.

Figure 9:
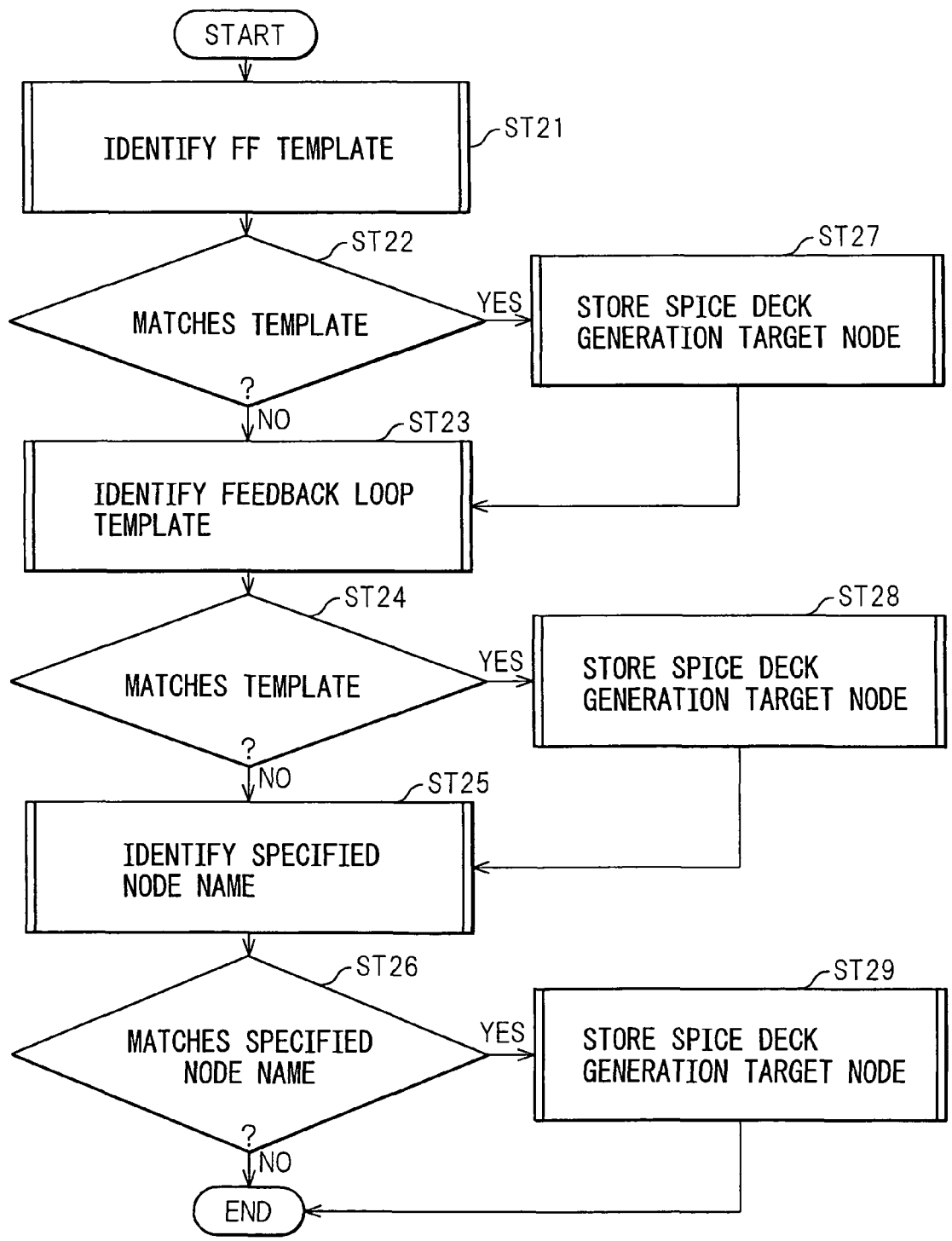
FIG. 9 is a flowchart illustrating in further detail a SPICE deck generation path analyzing process shown in FIGS. 6 to 8.

FIG. 9 is a flowchart illustrating in further detail the SPICE deck generation path analyzing process shown in FIGS. 6 to 8.

As shown in FIG. 9, when the SPICE deck generation path analyzing process is started, the FF template (FFtp, 31) is identified in step ST21, and the process proceeds to step ST22 to determine whether the circuit matches the template.

If it is determined in step ST22 that the circuit matches the template FFtp, the process proceeds to step ST27 where the SPICE deck generation target node (34) is stored, after which the process proceeds to step ST23. On the other hand, if it is determined in step ST22 that the circuit does not match the template FFtp, the process proceeds to step ST23 directly.

In step ST23, the feedback loop template (FLtp, 32) is identified, and the process proceeds to step ST24 to determine whether the circuit matches the template FLtp.

If it is determined in step ST24 that the circuit matches the template FLtp, the process proceeds to step ST28 where the SPICE deck generation target node (34) is stored, after which the process proceeds to step ST25. On the other hand, if it is determined in step ST24 that the circuit does not match the template FLtp, the process proceeds to step ST25 directly.

In step ST25, the specified node name is identified, and the process proceeds to step ST26 to determine whether the node matches the specified node name.

If it is determined in step ST26 that the node matches the specified node name, the process proceeds to step ST29 where the SPICE deck generation target node (34) is stored, after which the SPICE deck generation path analyzing process is terminated. On the other hand, if it is determined in step ST26 that the node does not match the specified node name, the SPICE deck generation path analyzing process is immediately terminated.

Figure 10:
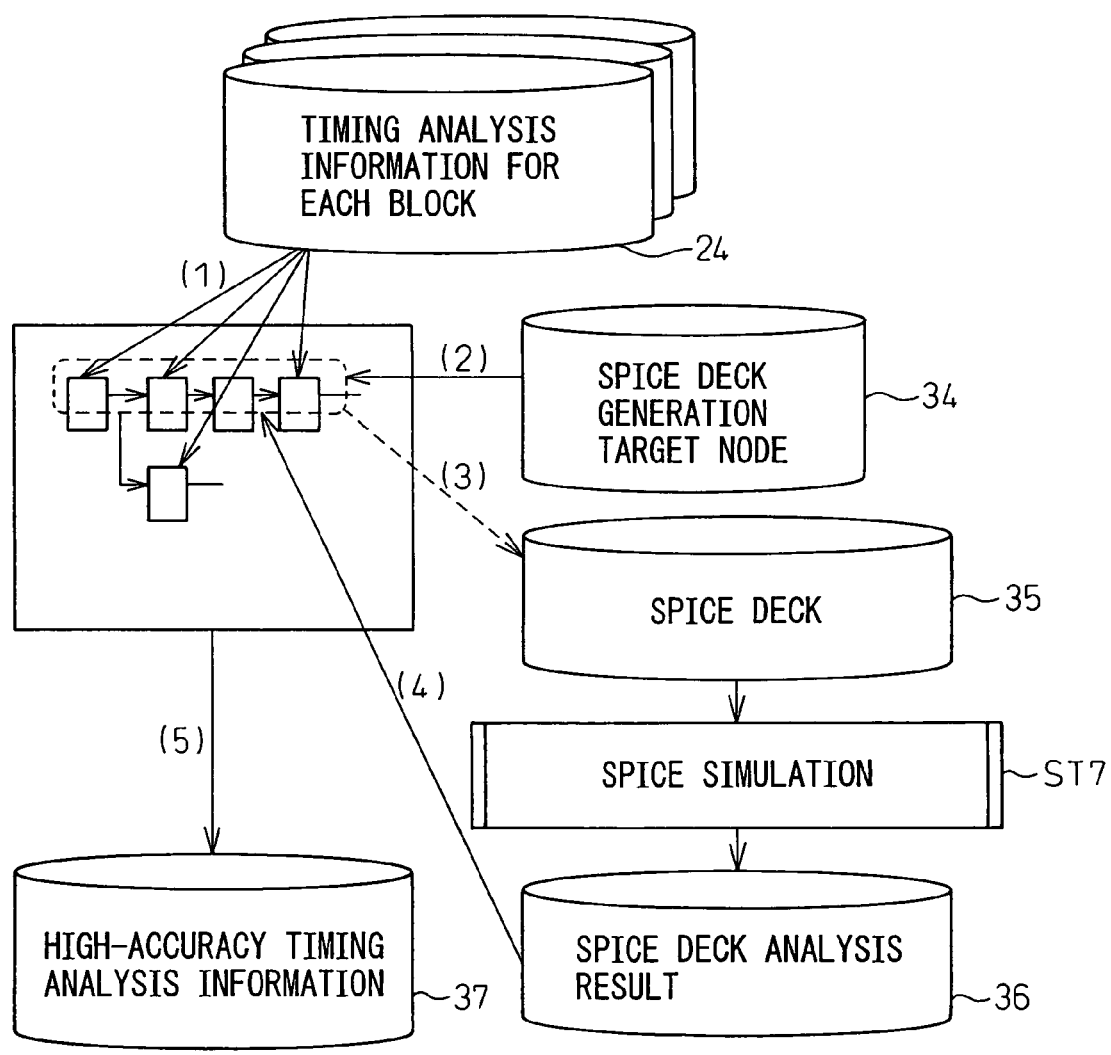
FIG. 10 is a diagram for explaining one example of a feedback-based STA process shown in FIG. 2.
Figure 11:
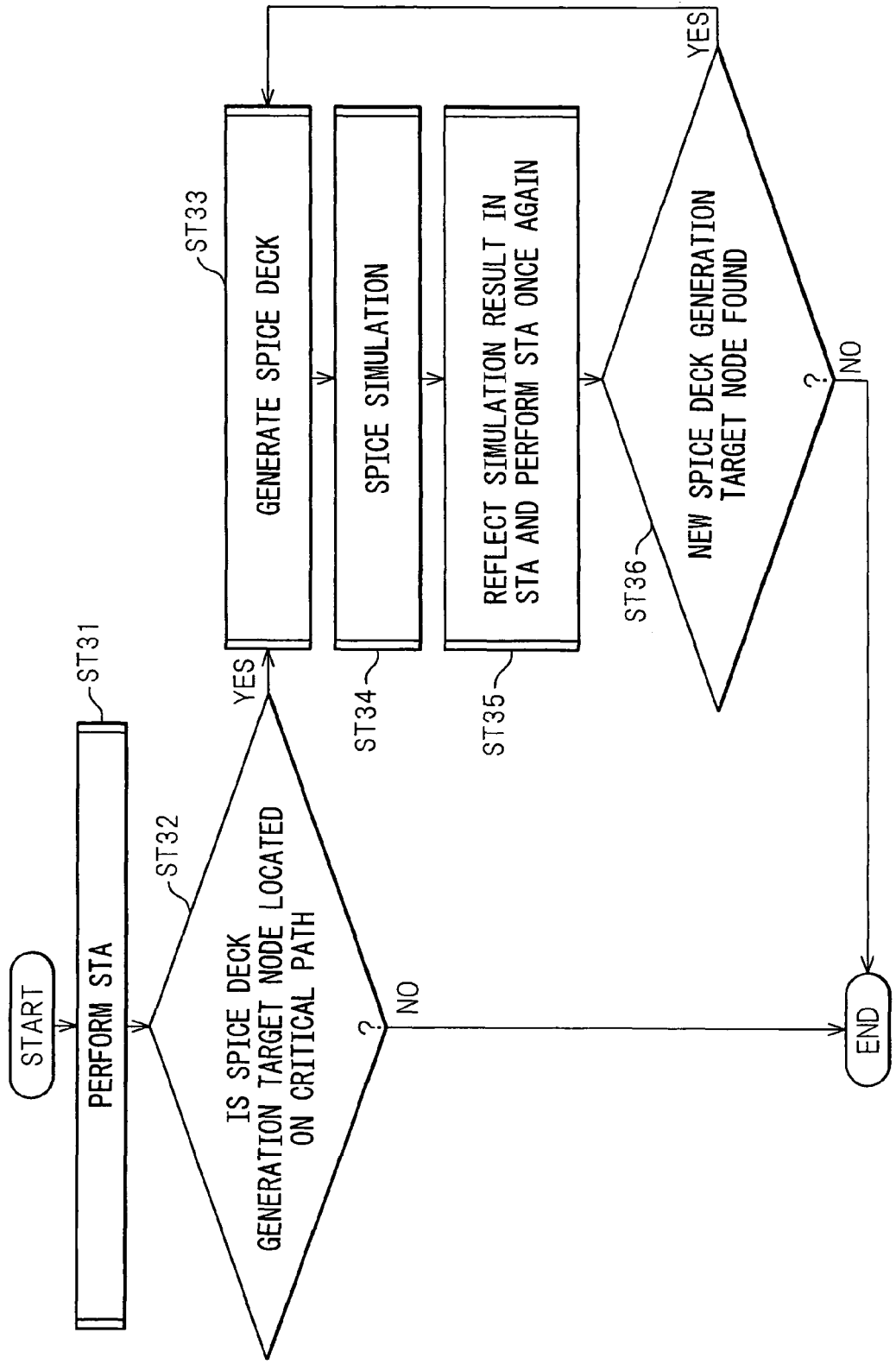
FIG. 11 is a flowchart illustrating in further detail the feedback-based STA process shown in FIG. 10.

FIG. 10 is a diagram for explaining one example of the feedback-based STA process shown in FIG. 2, and FIG. 11 is a flowchart illustrating in further detail the feedback-based STA process shown in FIG. 10.

The feedback-based STA section 300 creates high-accuracy delay analysis information by performing recalculation of the STA in accordance with the following procedure.

(1) STA is performed using the delay analysis information for each block (the timing analysis information 24 for each block).

(2) If the SPICE deck generation target node 34 is located on the critical path (MIN/MAX) calculated using the STA, the SPICE deck 35 is generated.

(3) Refer to the process performed by the SPICE deck generating section 600 to be described later with reference to FIG. 12.

(4) The result of the STA is substituted by the result of the calculation (ST7) performed using the SPICE deck 35 (the SPICE deck analysis result 36), and the STA is performed once again.

(5) If another path is calculated as the path (MIN/MAX) as a result of the recalculation of the STA, and if there is a SPICE deck target node on that path, the above steps (2) to (4) are repeated.

If a new SPICE deck is not generated here, the timing analysis information for the entire circuit (the high-accuracy timing analysis information 37) is generated, and the feedback-based STA process is terminated.

More specifically, as shown in FIG. 11, when the feedback-based STA process is started, STA is performed in step ST31, and the process proceeds to step ST32 to determine whether the SPICE deck generation target node is located on the critical path.

If it is determined in step ST32 that the SPICE deck generation target node is located on the critical path, the process proceeds to step ST33 to generate the SPICE deck, and the process further proceeds to step ST34 where SPICE simulation is carried out. Then, the process proceeds to step ST36 to determine whether a new SPICE deck generation target node is found, and the steps ST33 to ST35 are repeated until it is determined that a new SPICE deck generation target node is not found.

If it is determined in step ST36 that a new SPICE deck generation target node is not found, or if it is determined in step ST32 that the SPICE deck generation target node is not located on the critical path, the feedback-based STA process is terminated.

Figure 12:
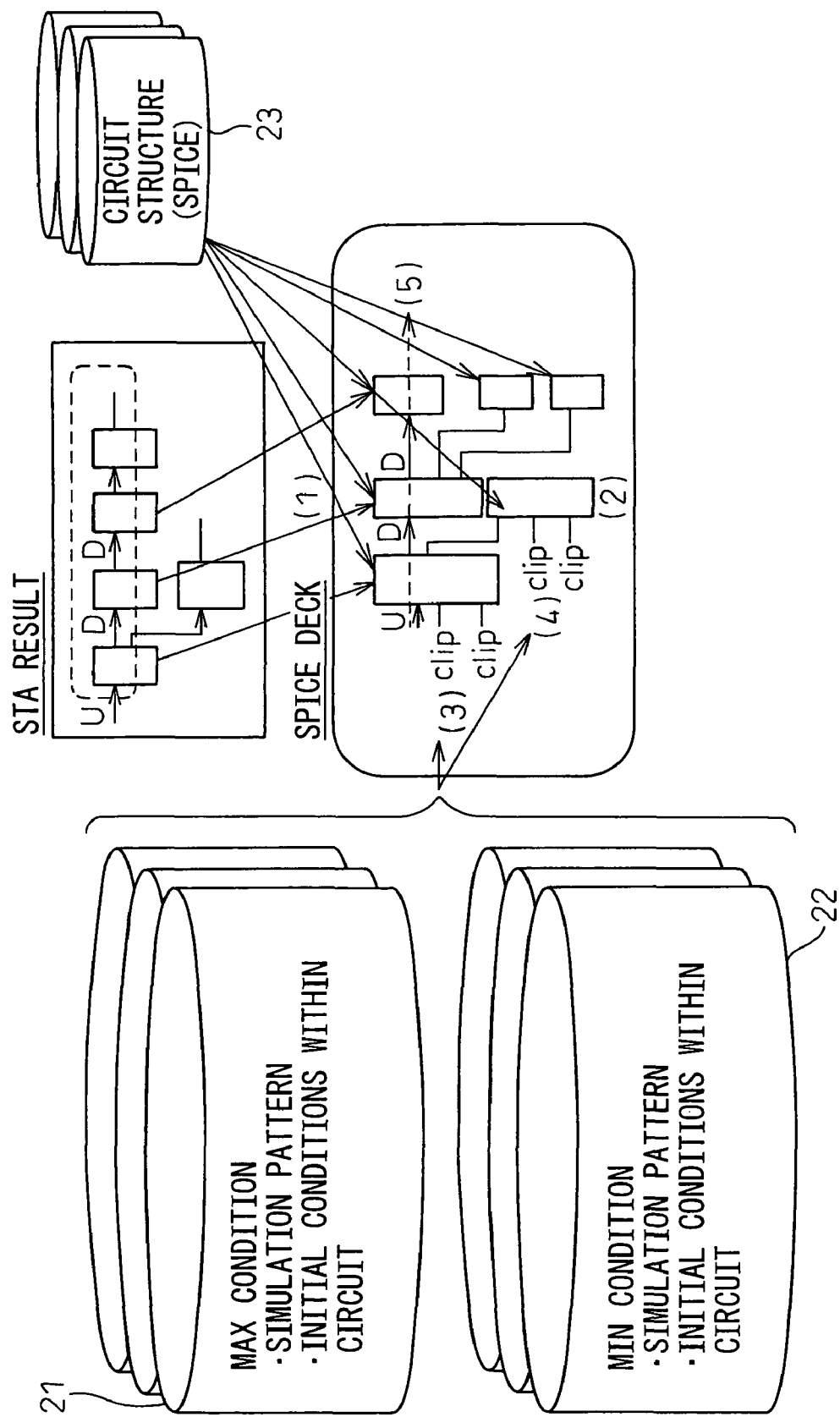
FIG. 12 is a diagram for explaining one example of a SPICE deck generation process shown in FIG. 2.
Figure 13:
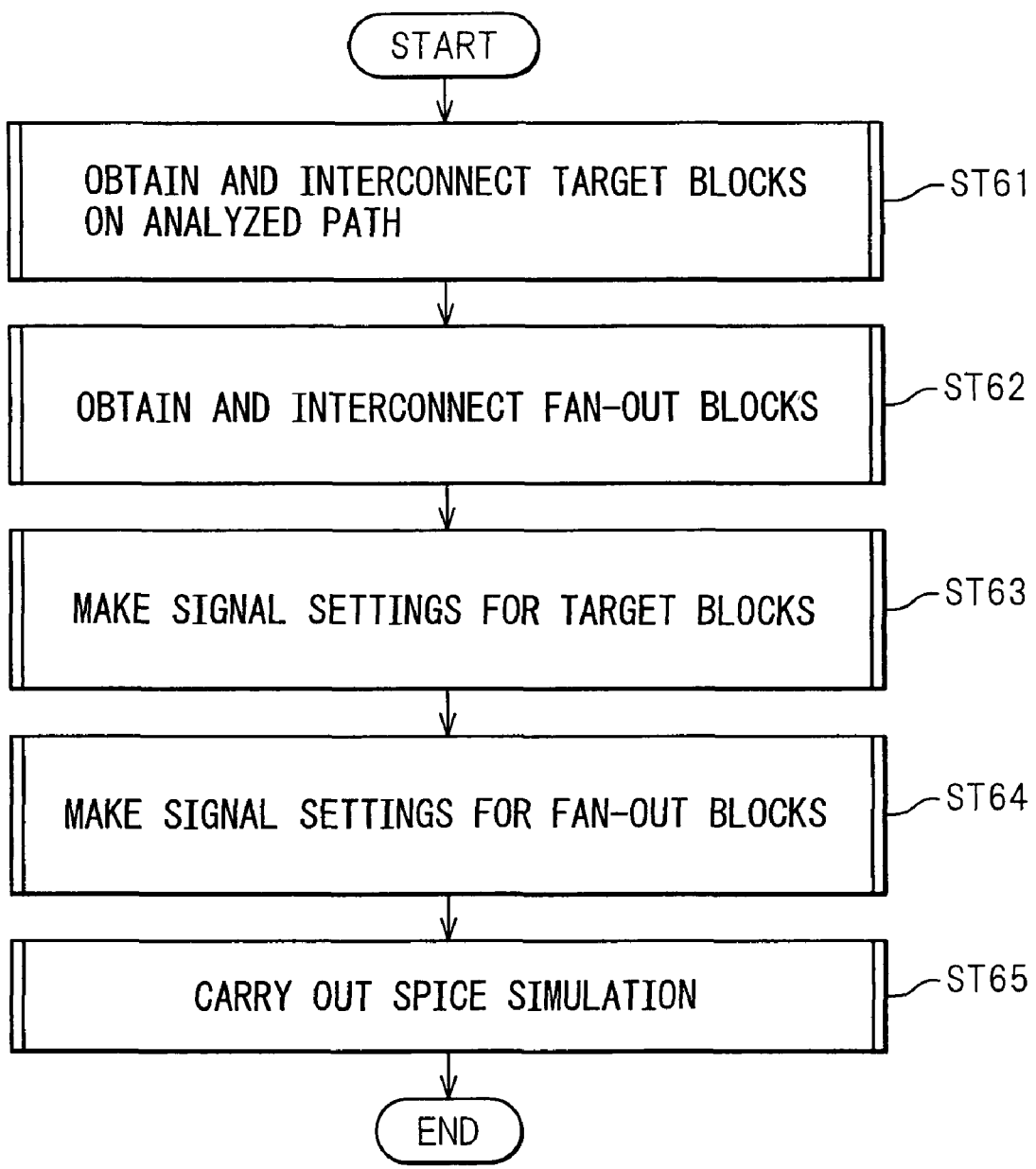
FIG. 13 is a flowchart illustrating in further detail the SPICE deck generation process shown in FIG. 12.

FIG. 12 is a diagram for explaining one example of the SPICE deck generation process shown in FIG. 2, and FIG. 13 is a flowchart illustrating in further detail the SPICE deck generation process shown in FIG. 12.

As shown in FIG. 12, the SPICE deck generating section 600 generates the SPICE deck (35) in accordance with the following procedure.

(1) From the path (STA result) obtained by the STA, blocks (target blocks) on the path are obtained, and the SPICE deck is generated by interconnecting the thus obtained target blocks.

(2) Blocks (fan-out blocks) connected to the block outputs not located on the propagation path of the target block signals (U/D: Up/Down) are reproduced.

(3) Input signal settings are made for paths other than the target block signal propagation path. The signal settings are acquired in accordance with the STA MIN/MAX conditions from the simulation pattern information 21 and 22 stored when analyzing the measurement target signals (U/D) on the attention path. Other simulation information such as the initial values of the internal nodes is also acquired from here.

(4) Signal settings are made for the fan-out blocks. The signal settings are acquired in accordance with the STA MIN/MAX conditions from the simulation pattern information 21 and 22 stored when analyzing the inputs connected to the target block outputs. Other simulation information such as the initial values of the internal nodes is also acquired from here.

(5) Signal settings (U/D) are made for the analysis target inputs, and the SPICE simulation is carried out.

That is, as shown in FIG. 13, when the SPICE deck generation process is started, the target blocks on the path are obtained and interconnected in step ST61, and the process proceeds to step ST62 where the fan-out blocks are obtained and interconnected.

The process further proceeds to step ST63 to make signal settings for the target blocks, and then proceeds to step ST64 to make signal settings for the fan-out blocks. Next, the process proceeds to step ST65, and the SPICE simulation is carried out, after which the SPICE deck generation process is terminated.

Figure 14:
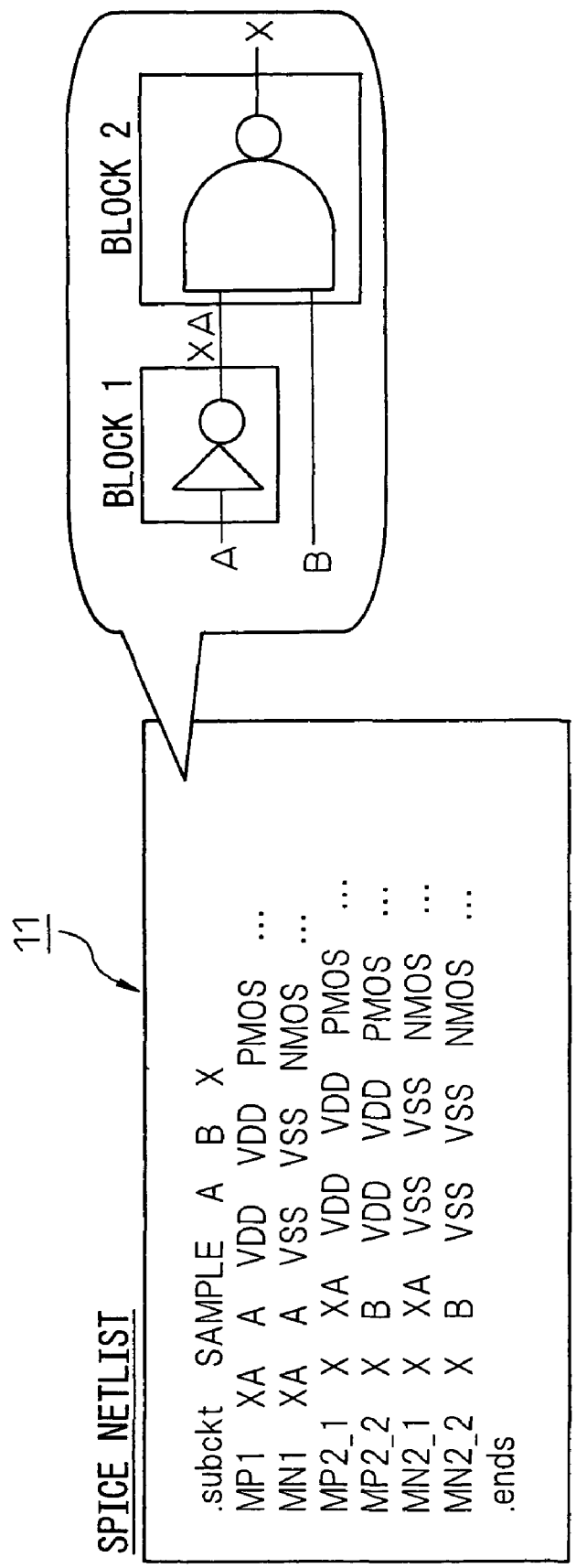
FIG. 14 is a diagram showing an example of the input to a block simulation information storing section.

FIG. 14 is a diagram showing an example of the input to the block simulation information storing section, and FIGS. 15 and 16 are diagrams each showing an example of the output from the block simulation information storing section.

The following description deals as an example the case where the block 1 is an inverter and the block 2 is a NAND gate.

First, the SPICE netlist (circuit data 11) input to the block simulation information storing section 100 contains information relating, for example, to the terminals (nodes) A, B, XA, and X, as shown in FIG. 14.

Further, the block simulation information storing section 100 outputs the simulation information for each block (the timing analysis information for each of the blocks 1 and 2) and the circuit configuration (circuit structure) for each block, such as shown in FIGS. 15 and 16, and these are stored in the respective storage devices (24 (21 and 22) and 23).

FIG. 17 is a diagram showing an example of the input to the SPICE deck generation path analyzing section, and FIG. 18 is a diagram showing an example of the output from the SPICE deck generation path analyzing section. In the examples of FIGS. 17 and 18, an inverter template is shown to simplify the explanation, but usually, the FF circuit template FFtp, the feedback loop template FLtp, or the node name list is used as earlier described.

That is, the template (inverter template) having a transistor configuration and a back-trace target node, such as shown in FIG. 17, is input to the SPICE deck generation path analyzing section 200, and the SPICE deck generation target node such as shown in FIG. 18 (when it is detected that "A" in the SPICE netlist corresponds to the back-trace node) is output from the SPICE deck generation path analyzing section 200 and stored in the storage device (34).

FIGS. 19 to 21 are diagrams each showing an example of the input to the feedback-based STA section, and FIG. 22 is a diagram showing an example of the output from the feedback-based STA section.

The simulation information for each block (the timing analysis information 24 for each block) and the circuit configuration for each block (the circuit structure 23), such as shown in FIGS. 19 and 20, and the SPICE deck generation target node (34), such as shown in FIG. 21, are input to the feedback-based STA section 300. That is, the feedback-based STA section 300 is supplied with the outputs from the block simulation information storing section 100 (i.e., the timing analysis information 24 (MAX condition 21 and MIN condition 22) for each block, the circuit structure 23, and the SPICE deck generation target node 34) that are stored in the respective storage devices (24 (21 and 22), 23, and 34).

The high-accuracy timing analysis information, such as shown in FIG. 22, is output from the feedback-based STA section 300 and stored in the storage device (37) via a SPICE deck generation determining section 400 (see FIG. 2).

The SPICE deck generation determining section 400 determines whether the analyzed path is a SPICE deck generation target path (ST4) and, if the analyzed path is a SPICE deck generation target path, the high-accuracy timing analysis information (37) output from the feedback-based STA section 300 is stored in the storage device (37).

Figure 24:
FIG. 24 is a diagram (part 2) showing an example of the input to the SPICE deck generating section.
Figure 25:
FIG. 25 is a diagram showing an example of the output from the SPICE deck generating section.

FIGS. 23 and 24 are diagrams each showing an example of the input to the SPICE deck generating section, and FIG. 25 is a diagram showing an example of the output from the SPICE deck generating section.

The simulation information for each block (MAX condition 21 and MIN condition 22: the timing analysis information 24 for each block) and the circuit configuration (circuit structure 23) for each block, such as shown in FIGS. 23 and 24, are input to the SPICE deck generating section 600.

The SPICE deck, such as shown in FIG. 25, is output from the SPICE deck generating section 600 and stored in the storage device (35). In the SPICE deck 35 output from the SPICE deck generating section 600 shown in FIG. 25, the block 1 is connected to the block 2, for example, and the node corresponding to the input terminal B (see FIG. 14) is set to "1" (VDD) from the simulation information, for example, to activate the path from the input terminal A to the output terminal X.

As described in detail above, according to the timing analysis method and apparatus of the present invention, a SPICE deck interconnecting partition blocks is generated by using the result of the STA and the SPICE simulation conditions for each block, for example, in the feedback-based STA section 300 (step ST3) and the SPICE deck generating section 600 (step ST6), and the result of the simulation performed using the SPICE deck is reflected in the STA; in the way, the accuracy of the timing analysis can be enhanced while, at the same time, improving work efficiency for the timing analysis.

FIG. 26 is a diagram for explaining a timing analysis program to which the present invention is applied, and an example of a medium having the timing analysis program recorded thereon. In FIG. 26, reference numeral 10 is a processing apparatus, 20 is a program (data) provider, and 30 is a portable recording medium.

The present invention is provided, for example, in the form of a program (data) for the processing apparatus (timing analysis apparatus) 10 such as shown in FIG. 26, and the program is executed on the processing apparatus 10. The processing apparatus 10 comprises an arithmetic processing unit 111, which includes a processor, and a processing apparatus local memory (for example, a RAM (Random Access Memory) and a hard disk) 112 which provides a program (data) to the arithmetic processing unit 111 or stores the results of the processing. The program (data) provided to the processing apparatus 10 is loaded and executed on the main memory of the processing apparatus 10.

The program (data) provider 20 has a program (data) storing means (a remote memory, for example, a DASD (Direct Access Storage Device)) 121 and provides the program (data) to the processing apparatus 10 via a line such as the Internet, or provides the program (data) to the processing apparatus 10 by means of the portable recording medium 30 which is, for example, an optical disk such as a CD-ROM or a DVD, or a magnetic disk such as a floppy disk. It will be appreciated that the medium on which the timing analysis program according to the present invention is recorded includes various kinds of media such as the processing apparatus local memory 112, the remote memory 121, and the portable recording medium 30.

The present invention can be widely applied to the timing analysis of various kinds of circuits, and is particularly effective for the timing analysis of large-scale integrated circuits, such as custom-made integrated circuits and CPUs specifically used for servers, that operate at high-speed clock frequencies.

As described in detail above, according to the present invention, a timing analysis method and apparatus can be provided that can enhance the accuracy of timing analysis while, at the same time, improving work efficiency for the timing analysis.

Many different embodiments of the present invention may be constructed without departing from the scope of the present invention, and it should be understood that the present invention is not limited to the specific embodiments described in this specification, except as defined in the appended claims.

What is claimed is:

1. A timing analysis method comprising:
   storing simulation information for each block when performing circuit analysis by partitioning a circuit into blocks;
   identifying a path that needs analysis and obtaining a SPICE deck generation target node;
   performing a static timing analysis;
   determining whether said obtained SPICE deck generation target node is located on a path that is analyzed by said static timing analysis;
   generating a SPICE deck by interconnecting said blocks, for said path that needs analysis, by using a result of said static timing analysis and using simulation conditions for said each block, when said obtained SPICE deck generation target node is located on said analyzed path;
   performing a SPICE simulation based on said generated SPICE deck;
   causing a result of the simulation performed using said generated SPICE deck to be reflected in said static timing analysis, by substituting the result of said static timing analysis by the result of said SPICE simulation; and
   performing said static timing analysis once again, wherein
   in identifying said path, if a circuit that matches a template is found, back-tracing is performed starting from a designated terminal of the circuit that matches said template, and a node passed through during said back-tracing is taken as said SPICE deck generation target node, and
   said back-tracing is performed in a direction going from a drain terminal of a transistor to a source terminal or a gate terminal thereof.

2. The timing analysis method as claimed in claim 1, wherein said template is an inverter template, a flip-flop circuit template, or a feedback loop template.

3. The timing analysis method as claimed in claim 1, wherein in identifying said path, an arbitrary node name is specified and, if a node that matches said node name is found, said node is taken as said SPICE deck generation target node.

4. A timing analysis apparatus comprising:
   a block simulation information storing section storing simulation information for each block when performing circuit analysis by partitioning a circuit into blocks;
   a SPICE deck generation path analyzing section which obtains a SPICE deck generation target node;
   a static timing analysis performing section performing a static timing analysis;
   a determining section determining whether said obtained SPICE deck generation target node is located on a path that is analyzed by said static timing analysis;
   a SPICE deck generating section, generating a SPICE deck by interconnecting said blocks, for a path that needs analysis, by using a result of said static timing analysis and using simulation conditions for said each block, when said obtained SPICE deck generation target node is located on said analyzed path;
   a SPICE simulation performing section performing a SPICE simulation based on said generated SPICE deck; and
   a feedback-based static timing analyzing section causing a result of the simulation performed by using said generated SPICE deck to be reflected in said static timing analysis, by substituting the result of said static timing analysis by the result of said SPICE simulation wherein said static timing analysis performing section performs said static timing analysis once again, once a circuit that matches said template is found, said SPICE deck generation path analyzing section performs back-tracing starting from a designated terminal of the circuit that matches said template, and takes a node passed through during said back-tracing as said SPICE deck generation target node, and said back-tracing is performed in a direction going from a drain terminal of a transistor to a source terminal or a gate terminal thereof.

5. The timing analysis apparatus as claimed in claim 4, wherein said SPICE deck generation path analyzing section obtains said SPICE deck generation target node by using an inverter template, a flip-flop circuit template, or a feedback loop template.

6. The timing analysis apparatus as claimed in claim 4, wherein said SPICE deck generation path analyzing section specifies an arbitrary node name and, once a node that matches said node name is found, takes said node as said SPICE deck generation target node.

7. A computer-readable medium having a timing analysis program for making a computer perform circuit timing analysis by causing said computer to at least execute:

storing simulation information for each block when performing circuit analysis by partitioning a circuit into blocks;

identifying a path that needs analysis and obtaining a SPICE deck generation target node;

performing a static timing analysis;

determining whether said obtained SPICE deck generation target node is located on a path that is analyzed by said static timing analysis;

generating a SPICE deck by interconnecting said blocks, for said path that needs analysis, by using a result of said static timing analysis and using simulation conditions for said each block, when said obtained SPICE deck generation target node is located on said analyzed path;

performing a SPICE simulation based on said generated SPICE deck;

causing a result of the simulation performed using said generated SPICE deck to be reflected in said static timing analysis by substituting the result of said static timing analysis by the result of said SPICE simulation; and performing said static timing analysis once again, wherein in identifying said path, if a circuit that matches a template is found, back-tracing is performed starting from a designated terminal of the circuit that matches said template, and a node passed through during said back-tracing is taken as said SPICE deck generation target node, and said back-tracing is performed in a direction going from a drain terminal of a transistor to a source terminal or a gate terminal thereof.

\* \* \* \* \*